US011171590B2

(12) United States Patent
Moser et al.

(10) Patent No.: US 11,171,590 B2
(45) Date of Patent: Nov. 9, 2021

(54) ELECTRONIC DEVICE, IN PARTICULAR AN ALTERNATOR REGULATOR, AND METHOD FOR REGULATING SUCH A DEVICE

(71) Applicant: MOTEURS LEROY-SOMER, Angouleme (FR)

(72) Inventors: Samuel Moser, Gond Pontouvre (FR); Jeremy Fratani, Magnac sur Touvre (FR); Vincent Morisseau, La Rochefoucauld (FR); Jean-Francois Paillou, Orleans (FR)

(73) Assignee: MOTEURS LEROY-SOMER, Angouleme (FR)

( * ) Notice: Subject to any disclaimer, the term of this patent is extended or adjusted under 35 U.S.C. 154(b) by 0 days.

(21) Appl. No.: 16/478,728

(22) PCT Filed: Jan. 16, 2018

(86) PCT No.: PCT/EP2018/050928
§ 371 (c)(1),
(2) Date: Jul. 17, 2019

(87) PCT Pub. No.: WO2018/134171
PCT Pub. Date: Jul. 26, 2018

(65) Prior Publication Data
US 2020/0052630 A1 Feb. 13, 2020

(30) Foreign Application Priority Data
Jan. 20, 2017 (FR) .................................. 1750486

(51) Int. Cl.
*H02P 9/30* (2006.01)
*H02K 7/18* (2006.01)
(Continued)

(52) U.S. Cl.
CPC ............ *H02P 9/305* (2013.01); *H02K 7/1815* (2013.01); *H02K 11/046* (2013.01);
(Continued)

(58) Field of Classification Search
CPC ... H02P 9/305; H02P 2101/25; H02K 7/1815; H02K 11/046; H05K 7/1432; H05K 7/209
See application file for complete search history.

(56) References Cited

U.S. PATENT DOCUMENTS 5,739,676 A * 4/1998 Judge .................... H02J 7/1423
                                                    322/22
8,810,178 B2    8/2014 Leon
(Continued)

FOREIGN PATENT DOCUMENTS

CN        205430848 U     8/2016
DE   10 2008 037 064 A1   2/2010
EP         2 747 270 A1   6/2014

OTHER PUBLICATIONS

U.S. Appl. No. 16/478,732, filed Jul. 17, 2019, 2019/0373762 A1, Samuel Moser, et al.
(Continued)

*Primary Examiner* — Sean Gugger
(74) *Attorney, Agent, or Firm* — Oblon, McClelland, Maier & Neustadt, L.L.P.

(57) ABSTRACT

An electronic device, in particular an alternator regulator, comprising a power stage to be connected to an inductive load, in particular to an alternator inductor, comprising at least one first pair of power transistors connected to a terminal of a DC bus, and a control circuit for said transistors, the transistors being disposed in parallel between said terminal of the DC bus and a first output to be connected to the load, at least one flyback diode connecting the opposite terminal of the DC bus to the first output, the control circuit
(Continued)

being designed to generate a pulsed control signal for regulating the current in the load and for detecting a failure of one of the transistors, the control circuit being designed, during normal operation, to send the control signal to one of the transistors of the first pair, while maintaining the other transistor of said pair in an off-state.

15 Claims, 13 Drawing Sheets

(51) Int. Cl.
    *H02K 11/04*      (2016.01)
    *H05K 7/14*      (2006.01)
    *H05K 7/20*      (2006.01)
    *H02P 101/25*      (2016.01)

(52) U.S. Cl.
    CPC ........... *H05K 7/1432* (2013.01); *H05K 7/209* (2013.01); *H02P 2101/25* (2015.01)

(56) References Cited

U.S. PATENT DOCUMENTS

| | | | | |
|---|---|---|---|---|
| 2010/0066431 A1* | 3/2010 | Carter | ........................ | H02J 1/10 327/408 |
| 2010/0141189 A1* | 6/2010 | Matt | ........................ | H02P 27/06 318/400.26 |
| 2010/0202109 A1 | 8/2010 | Zheng et al. | | |
| 2010/0258206 A1* | 10/2010 | Baker | ................... | E04H 4/1236 137/565.01 |
| 2011/0133677 A1* | 6/2011 | Franke | ................... | B60L 58/33 318/400.3 |
| 2012/0286744 A1* | 11/2012 | Tunzini | ................. | H02J 7/1461 322/24 |
| 2014/0077745 A1* | 3/2014 | Kinouchi | ................ | H02P 27/06 318/514 |
| 2014/0198455 A1 | 7/2014 | Masuda et al. | | |
| 2015/0326145 A1* | 11/2015 | Karlsson | ............ | H02M 7/5387 363/98 |

OTHER PUBLICATIONS

U.S. Appl. No. 16/478,735, filed Jul. 17, 2019, 2020/0053906 A1, Samuel Moser, et al.
U.S. Appl. No. 16/478,711, filed Jul. 17, 2019, 2019/0335604 A1, Samuel Moser, et al.
U.S. Appl. No. 16/478,769, filed Jul. 17, 2019, 2020/0053907 1, Samuel Moser, et al.
International Search Report dated Mar. 19, 2018, in PCT/EP2018/050928 filed on Jan. 16, 2018.
Preliminary French Search Report dated Oct. 9, 2017, in FR 1750486 filed on Jan. 20, 2017 (2 pages).
Paynter, D. A et al., "Session IV: Power and Control, 4.5: Redundancy Techniques in Reliable Power Supply Design", University Museum (University of Pennsylvania), vol. 3, 1961, 2 pages, XP055457652.

* cited by examiner

ELECTRONIC DEVICE, IN PARTICULAR AN ALTERNATOR REGULATOR, AND METHOD FOR REGULATING SUCH A DEVICE

The present invention relates to electronic devices, such as variable drives or regulators, comprising a power stage.

PRIOR ART

Variable drives or regulators are devices that are used in connection with industrial motors or alternators to control the speed or the voltage thereof.

These devices conventionally comprise power components, such as IGBTs or MOSFETs, for example, mounted on a radiator, and fairly large electrochemical capacitors.

The tendency is to attempt to reduce the spatial requirement of such devices.

Numerous solutions have already been proposed to this end.

Application US 2014/0198455 discloses a variable speed drive comprising power components mounted on a printed circuit board, and capacitors disposed at 90° to this board.

Application US 2010/0202109 discloses a device, in which the capacitors are disposed next to the radiator and traverse openings of a cooling air guide.

Patent U.S. Pat. No. 8,810,178 discloses a variable speed drive comprising a casing provided with openings traversed by the capacitors. A seal in the form of a perforated sheet is disposed under the openings of the casing. A detachable lid covers the ends of the capacitors that exceed the openings.

Utility model CN 205430848 U discloses a drive, the radiator of which supports a printed circuit board via spacers, onto which board the capacitors are soldered. The radiator has a cutout, into which the capacitors extend.

There is a requirement for further improvement of the electronic devices, such as the variable drives or regulators, particularly in order to make them even more compact, while maintaining high reliability and a manufacturing cost that is compatible with the industrial requirements for this type of product.

Furthermore, in order to provide the coiled rotor alternators with an excitation current, the voltage regulators conventionally use a power bridge that is at least formed by an IGBT and a flyback diode. In order to allow high-speed de-excitation under certain conditions, a half H-bridge can be used in order to invert the voltage at the terminals of the inductor of the alternator. Certain extreme operating conditions, such as, for example, over-excitation or use at an excessive ambient temperature, can cause the breakage of one of these power components. This breakage renders the device completely inoperative and the over-excitation or under-excitation that is generated can, in some applications, such as the extraction of tunnel fumes, the supply of electricity to a hospital, or the power supply for cooling pumps of nuclear reactors, prove to be critical.

Consequently, there is a benefit in further improving the reliability of the alternator regulators.

There is also a requirement for facilitating the attachment of the unit on a support.

The aim of the invention is to address all or some of these requirements.

SUMMARY

According to a first aspect of the invention, the aim of the invention is an electronic device, also called a unit, in particular a variable speed drive or alternator regulator, comprising at least one power component mounted on a heat sink, also called a radiator, and a plurality of capacitors extending through at least one opening of the heat sink.

Preferably, the device comprises a recess, which accommodates a sheet seal that is applied, on the one hand, on an internal face of the heat sink and, on the other hand, on an internal face facing a casing fitted onto the heat sink, with the internal faces of the heat sink and of the casing coming into contact.

This aspect of the invention contributes to the compactness of the unit, while providing effective cooling of the power component. The seal allows any water ingress into the unit to be avoided, and the fact that it is accommodated in a recess allows contact surfaces to be arranged between the heat sink and the casing in order to promote a heat transfer from the heat sink to the casing.

The recess is preferably produced in the casing. Said casing can be produced as two assembled parts. The casing is made of metal or of plastic material, for example.

At least one from among the casing and the heat sink can comprise centering studs and the seal can have corresponding holes, in which the centering studs are engaged. This thus limits the risk of incorrect positioning of the seal in the aforementioned recess.

The seal can comprise an opening, in which a metal spacer is disposed, extending between the heat sink and an ancillary power component, in particular a diode bridge.

Preferably, the power component is applied on the heat sink through an opening of the casing. Thus, the quality of the thermal contact between the power component and the heat sink can be improved.

The power component can be soldered onto a printed circuit board of a power card, said board having slots for forming flexible tabs, on which conductive tracks extend, onto which the pins of the power component are soldered. Thus, an assembly is produced that is capable of a certain degree of elastic deformation, which facilitates the correct positioning of the power component on the heat sink and limits the risk of breakage of the module through force on the pins thereof.

The unit can comprise a plurality of capacitors, for example, five, disposed as a U-shape, the concavity of the U-shape being oriented toward the power component. This further increases the compactness.

The power component can comprise a plurality of power transistors, in particular IGBT or MOSFET transistors.

A further aim of the invention, according to a second aspect that is independent of the first aspect, but which advantageously can be combined therewith, is an electronic device, in particular a variable speed drive or alternator regulator, comprising a heat sink and a power card comprising a printed circuit board, housed in a casing.

Preferably, the device comprises a part attached, on the one hand, to the heat sink and attached, on the other hand, to the board and coming into contact with at least one conductive track of the power card, so as to provide an electrical contact between the heat sink and said track, said part having a face that is accessible from the outside of the device for attaching a lug connected to a ground and/or an earth cable.

This assembly allows both the electrical and mechanical connection to be established between the heat sink and the power card in a reliable manner and in a manner that contributes to the compactness of the device, since the same part also can be used for an external connection.

The part can have a hole for receiving an attaching screw for said lug.

The device can comprise a casing having an opening for the passage of the part. This casing can comprise two assembled parts, the opening being produced in a part of the casing that is in contact with the heat sink. The power card can be attached on the casing, in particular on shafts for receiving screws of said casing.

The device can comprise a printed circuit board between the printed circuit board of the power card and the heat sink. This board can support connectors and/or terminals. The provision of such a board allows the space left free under the power card to be used and the compactness of the device to be further improved.

The device preferably comprises connectors and/or terminals on three sides, as well as on the front face thereof.

A further aim of the invention, according to a third aspect thereof, independent of the two aforementioned aspects, but which advantageously can be combined with any of said aspects, is an electronic device, in particular a variable speed drive or alternator regulator, comprising a casing, the front of which has a housing for accommodating an ancillary module, a hatch for closing said housing, and an electronic circuit comprising an interface card defining a housing for accommodating a memory card, opening into the housing for accommodating the ancillary module.

The invention, according to this aspect, allows access to the memory card to be prevented as long as the hatch is in place, which is the normal situation, with the hatch only being intended to be removed for a maintenance operation. The device thus advantageously can comprise a tamperproof label at least partially covering the hatch. Furthermore, disposing the housing for accommodating the memory card at this location means that it is possible to benefit from the clearance that is provided by the housing for accommodating the ancillary module in order to install and remove the card, which contributes to the compactness of the device and to its ergonomics.

The interface card preferably comprises a screen and buttons accessible through holes in the casing.

The housing for the memory card preferably opens into a recess of the casing intended to accommodate a locking tab of the hatch. This locking tab preferably comprises a through-hole for a screw.

A variety of information can be recorded in the memory card. Preferably, the device is configured to record an operating log of the device on the memory card.

Preferably, the device comprises at least one front connector, in particular of the RJ45 or USB type. This connector can be used for updating the device, without having to perform any disassembly operations.

This front connector or these front connectors can be supported by extensions of a printed circuit board of the interface card, extending on both sides of the aforementioned recess intended to accommodate the locking tab of the hatch. This allows even more compactness to be provided.

The casing can comprise assembled lower and upper parts, the housing being produced in the upper part of the casing. The lower part is advantageously attached to a heat sink, the casing housing a power card and a control card that are superposed, the interface card being disposed above the control card, the housing extending underneath the interface card when the unit is disposed vertically with the opening of the housing for accommodating the memory card oriented downward. Such an arrangement proves to be ergonomic, compact and easy to assemble and maintain.

A further aim of the invention, according to another aspect thereof, which is independent of the preceding aspects, but which advantageously can be combined therewith, is an electronic device, in particular an alternator regulator, comprising a power stage to be connected to an inductive load, in particular to an alternator inductor, comprising at least one first pair of power transistors connected to a terminal of a DC bus, and a control circuit for said transistors, the transistors being disposed in parallel between said terminal of the DC bus and a first output to be connected to the load, at least one flyback diode connecting the opposite terminal of the DC bus to the first output, the control circuit being designed to generate a pulsed control signal for regulating the current in the load and for detecting a failure of one of the transistors, the control circuit being designed, during normal operation, to send the control signal to one of the transistors of the first pair, while maintaining the other transistor of said pair in an off-state.

Such an aspect of the invention provides enhanced reliability with respect to the operation of the device.

The control circuit is advantageously designed, in the event of the failure of one transistor of the first pair causing it to remain in an open circuit, to send the pulsed control signal to the other transistor of said pair.

Preferably, the device comprises a second pair of transistors connected in parallel between a second output to be connected to the load and the opposite terminal of the DC bus, at least one diode connecting the second output to the terminal of the DC bus, at least one of the transistors of the second pair being controlled by the control circuit in order to be in an on-state during normal operation of the unit.

Preferably, the other transistor of the second pair is controlled by the control circuit in order to be in an off-state during normal operation.

The control circuit is preferably designed, in the event of the failure of one of the transistors of the second pair causing it to remain in an open circuit, to control the other transistor of said pair in order to saturate said transistor.

The control circuit is preferably designed, in the event of the failure of a transistor of the first pair causing it to remain in an open circuit, to control the second transistor of said pair in order to saturate said transistor, to maintain a transistor of the other pair in the off-state and to send the pulsed control signal to the other transistor of said second pair.

The device can comprise two flyback diodes in parallel.

The device also can comprise two diodes in parallel connecting the second output to the terminal of the DC bus.

The device is advantageously produced so as to be able to operate in a mode for inverting the voltage at the terminals of the load, also called "negative forcing", when the current in the load has to be rapidly cancelled for the purposes of the regulation, in which mode the transistors of the first pair are controlled in the off-state, as are the two transistors of the second pair.

The pulsed control signal preferably is a PWM (Pulse Width Modulation) control signal.

The transistors of the first pair can belong to a power module comprising three branches in parallel, each branch comprising two transistors in series, and a seventh transistor in series with a diode, the assembly formed by this transistor in series with the diode being connected in parallel with the three branches, the transistors of the first pair each being held within a respective branch. One of the transistors of the second pair can be held within the remaining branch and the other transistor can be formed by the transistor that is in series with the diode.

The transistors can be IGBTs or MOSFETs, or even can be replaced by thyristors or bipolar transistors. Preferably, the components used to produce the bridge are IGBTs.

A further aim of the invention is a method for regulating an alternator, in which the inductor of the alternator is connected to the outputs of a regulator comprising:
- a power stage comprising:
  - a first pair of power transistors connected in parallel between a terminal of a DC bus and a first terminal of the inductor;
  - a second pair of transistors connected in parallel between a second terminal of the inductor and an opposite terminal of the DC bus;
  - at least one diode connecting the second terminal of the inductor to the terminal of the DC bus;
  - at least one flyback diode connecting the opposite terminal of the DC bus to the first terminal of the inductor;
- a control circuit designed to generate a pulsed control signal for regulating the current in the inductor and for detecting a failure of one of the transistors, in which method:
- during normal operation of the regulator, at least one of the transistors of the second pair is controlled by the control circuit so as to be in the on-state, the control signal is sent to one of the transistors of the first pair, while maintaining the other transistor of said pair in an off-state;
- in the event of a request for rapid cancellation of the current in the inductor for the purposes of the regulation, the transistors of the first pair and the transistors of the second pair are controlled in the off-state;
- in the event of the failure of a transistor of the first pair causing it to remain in an open circuit, the pulsed control signal is sent to the other transistor of said pair for the purposes of regulating the current in the inductor;
- in the event of the failure of one of the transistors of the second pair causing it to remain in an open circuit, the other transistor of said pair is controlled in order to saturate said transistor;
- in the event of the failure of a transistor of the first pair causing it to remain in an open circuit, the second transistor of said pair is controlled in order to saturate said transistor, a transistor of the other pair is maintained in the off-state and the pulsed control signal is sent to the other transistor of said second pair for the purposes of regulating the current in the inductor.

A further aim of the invention, according to a fifth aspect thereof, which can be combined with the aforementioned aspects, is an assembly comprising:
- an electronic device, in particular a variable speed drive or alternator regulator, comprising a casing, the rear of which is equipped with a heat sink, produced from a metal profile section, for cooling at least one power component;
- a first assembly of elements for attaching the device on a support, each comprising at least one tab to be engaged in the profile section by sliding it therein, and an attachment lug provided with at least one screw through-hole;
- a second assembly of elements for attaching the device on a support, each comprising at least one tab to be engaged in the profile section by sliding it therein, and an attachment lug provided with at least one screw through-hole, the elements being of different shapes.

The invention according to this aspect facilitates the assembly of the device in various configurations of available space by allowing the most suitable elements to be selected.

The elements of the first and/or of the second assembly can each comprise two tabs.

The elements of the first assembly can comprise at least one hole substantially disposed in the extension of a tab.

The elements of the second assembly can each comprise at least one hole laterally disposed on the side of the heat sink.

The elements can each axially come into abutment against a longitudinal end of the heat sink.

The lugs can be, when the elements are mounted on the heat sink, located in a plane that is offset from that of the tabs.

The profile section can comprise slides for accommodating tabs, each formed by two fins provided with folded edges directed toward each other and an intermediate fin of lesser height provided with a plate on the free edge thereof.

The tabs can have tapped holes for receiving screws for tightening the aforementioned plates, which screws come into abutment on said plates when they are tightened.

DETAILED DESCRIPTION

The present invention will be better understood upon reading the following detailed description of non-limiting embodiments thereof, and with reference to the accompanying drawings, in which:

FIG. 11 shows a detailed view of FIG. 10A;

FIG. 12 is an exploded view revealing certain constituent components of the unit;

Figure 1:
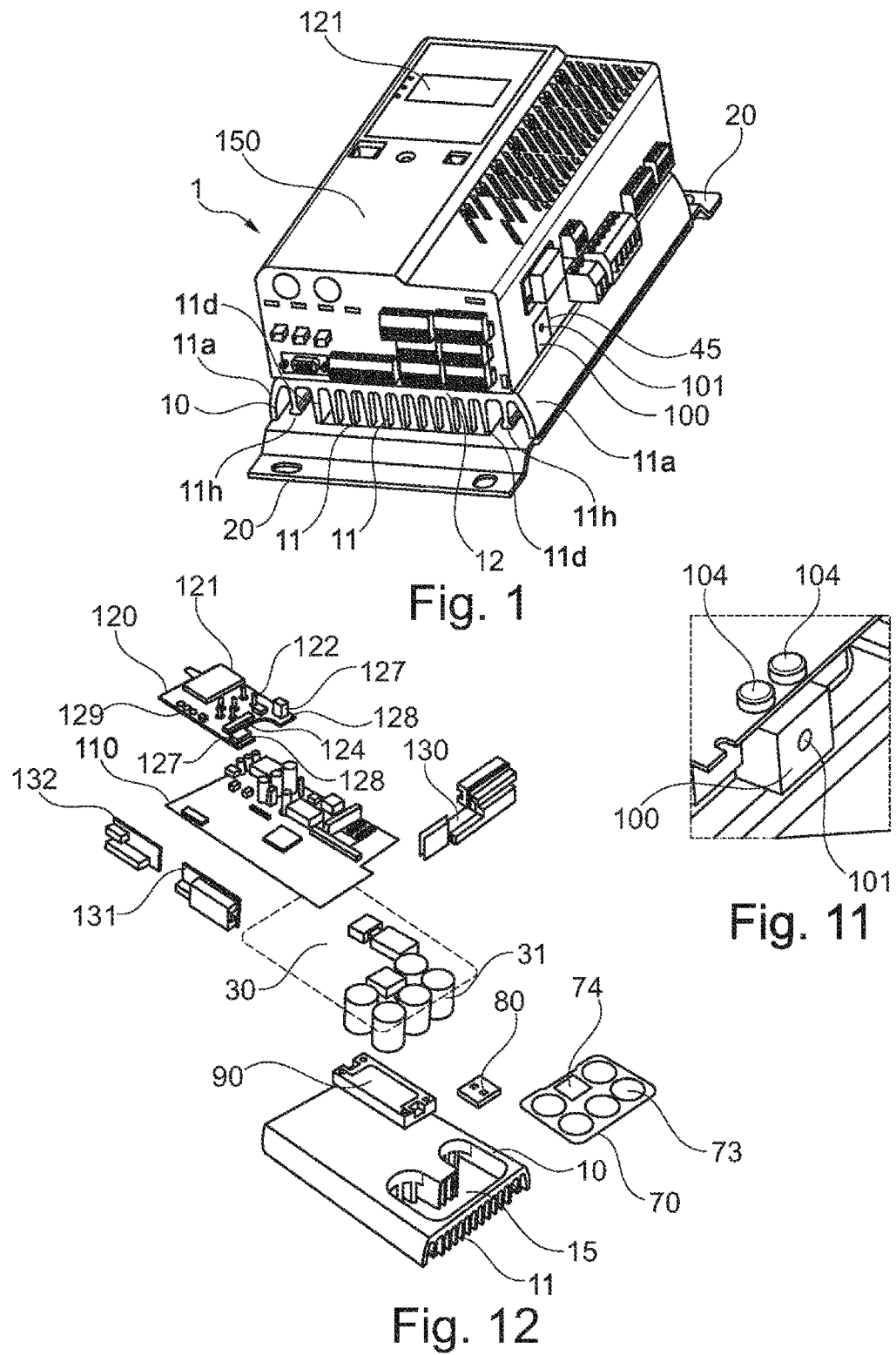
FIG. 1 shows a schematic perspective view of an example of a unit according to the invention.

The unit 1 shown in FIGS. 1 to 12 is an alternator regulator, but the invention is not limited to an alternator regulator and is also applicable to a variable speed drive or to an inverter, among other units implementing relatively bulky power components and electrochemical capacitors.

The unit 1 comprises a heat sink 10, also called a radiator, at the rear, which heat sink has parallel fins 11, the bases of which connect to a wall 12. The radiator 10 is conventionally made of aluminum or aluminum alloy using a die, for example.

The unit 1 can be devoid of a fan, with the cooling of the radiator 10 being carried out by natural convection only.

Figure 2:
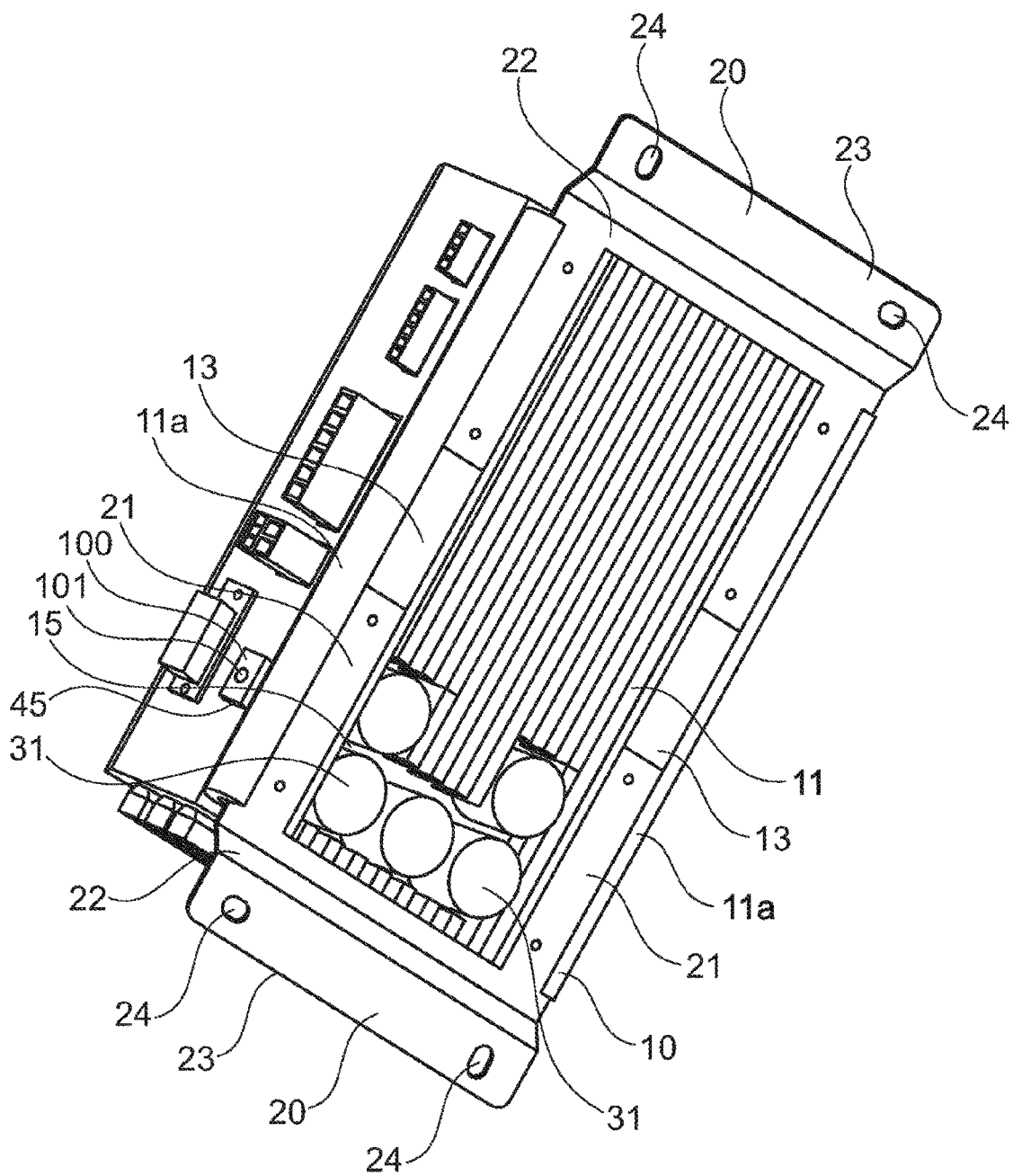
FIG. 2 shows a bottom view of the unit.
Figure 3:
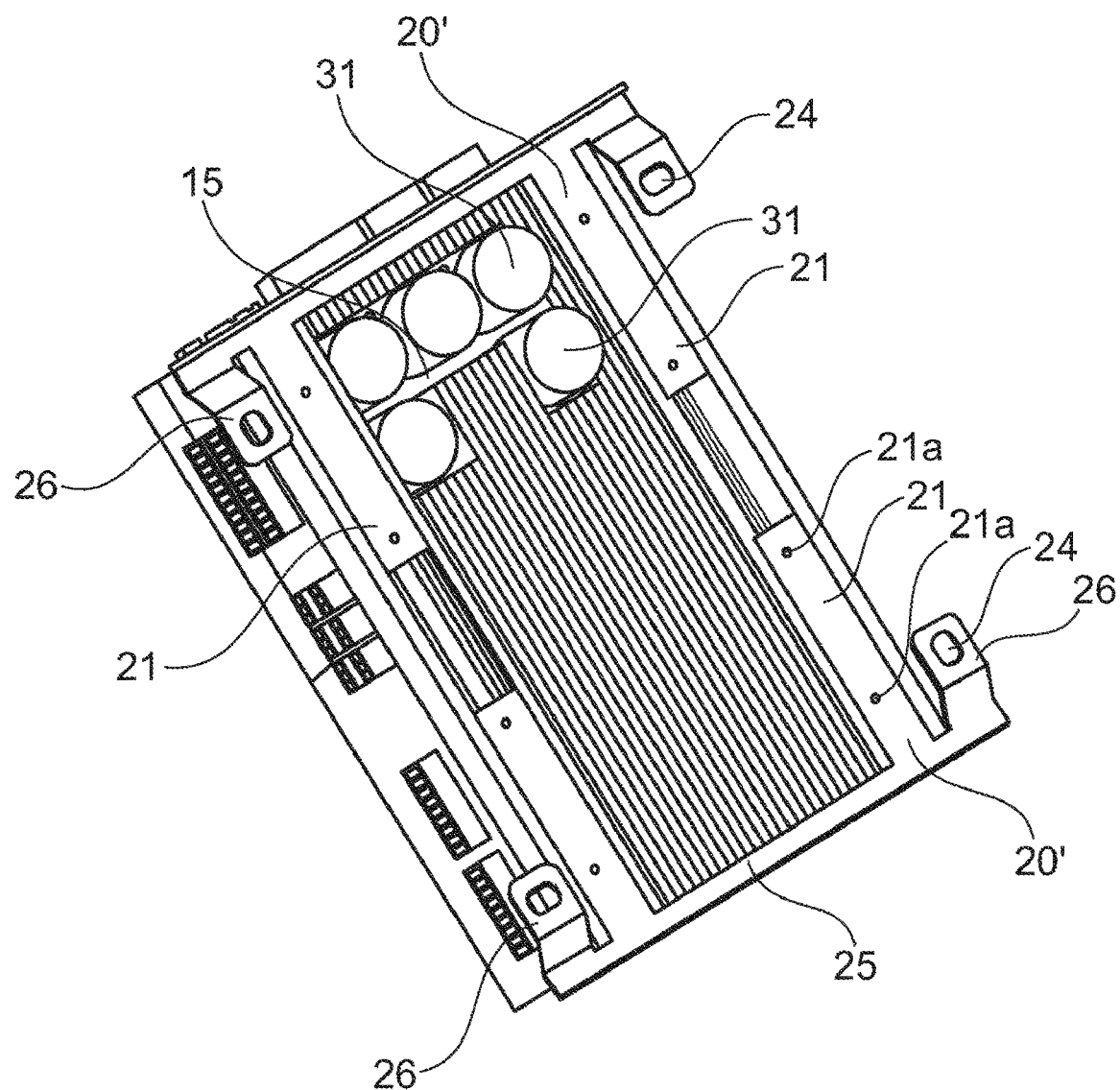
FIG. 3 is a view similar to FIG. 2 of an alternative embodiment.

The radiator 10 defines two longitudinal slides 13, each extending along the outermost fin 11a, intended to accommodate different shaped attachment elements 20 or 20', respectively shown in FIGS. 2 and 3.

The fin 11a has, on the free edge thereof, a folded edge 11b that is folded inwardly. This folded edge 11b faces a folded edge 11c directed toward the fin 11a, supported by a fin 11d of the radiator 10, as shown in FIG. 10B. The folded edges 11b and 11c are coplanar. An intermediate fin 11g of lesser height extends between the fins 11a and 11d. This fin 11g is provided, on the free edge thereof, with a ribbed plate 11h.

Attachment of the Unit

The elements 20 and 20' are used to attach the unit on a reception surface.

The possibility of using different shaped elements 20 and 20' increases the number of fitting configurations for the unit.

Each element 20 comprises two tabs 21 each engaged in a slide 13, with these tabs 21 being connected by a strip 22 that is doubly bent in order to define an attachment lug 23 parallel to the strip 22, or perpendicular to the tabs 21, but located at a different height.

The lugs 23 are each traversed by two holes 24.

In the variation of FIG. 3, the strip 22 is replaced by a bracket 25 provided with two attachment lugs 26 directed toward the unit 1, whereas in the example of FIG. 2 the lugs 23 are directed toward the outside and not toward the unit 1. Each lug 26 is provided with a hole 24.

Each tab 21 engaged in a slide 13 comes into abutment against the folded edges 11b and 11c via a face.

A user wishing to attach the unit 1 selects the attachment elements 20 or 20' that are adapted to the specific case, and engages them in the slides 23. One or more screws, traversing the elements 20 or 20' in the tapped holes 21a provided to this end, press against the ribbed plate 11h in order to maintain the element 20 or 20' in position in the slides 13, then the user proceeds to attach the unit 1 by virtue of the screws engaged in the holes 24, for example.

Assembly of the Capacitors

The unit 1 comprises a plurality of electronic cards, including a card 30 called a power card, which supports electrochemical DC bus capacitors 31 that are relatively bulky, for example, with a capacity that is greater than or equal to 200 μF at an isolation voltage that is greater than or equal to 250 VDC, in particular 400 VDC.

These capacitors 31 extend rearward in an opening 15 of the radiator 10. In the considered example, there are five capacitors 31 and the opening 15 assumes the general shape of a U, the concavity of which is turned inward, as shown in FIG. 2 or 3 in particular.

In the considered example, the fins 11 are tall enough to prevent the capacitors 31 from rearwardly exceeding the radiator 10; thus, the capacitors 31 remain relatively protected against any impacts by the fins 11.

Figure 6:
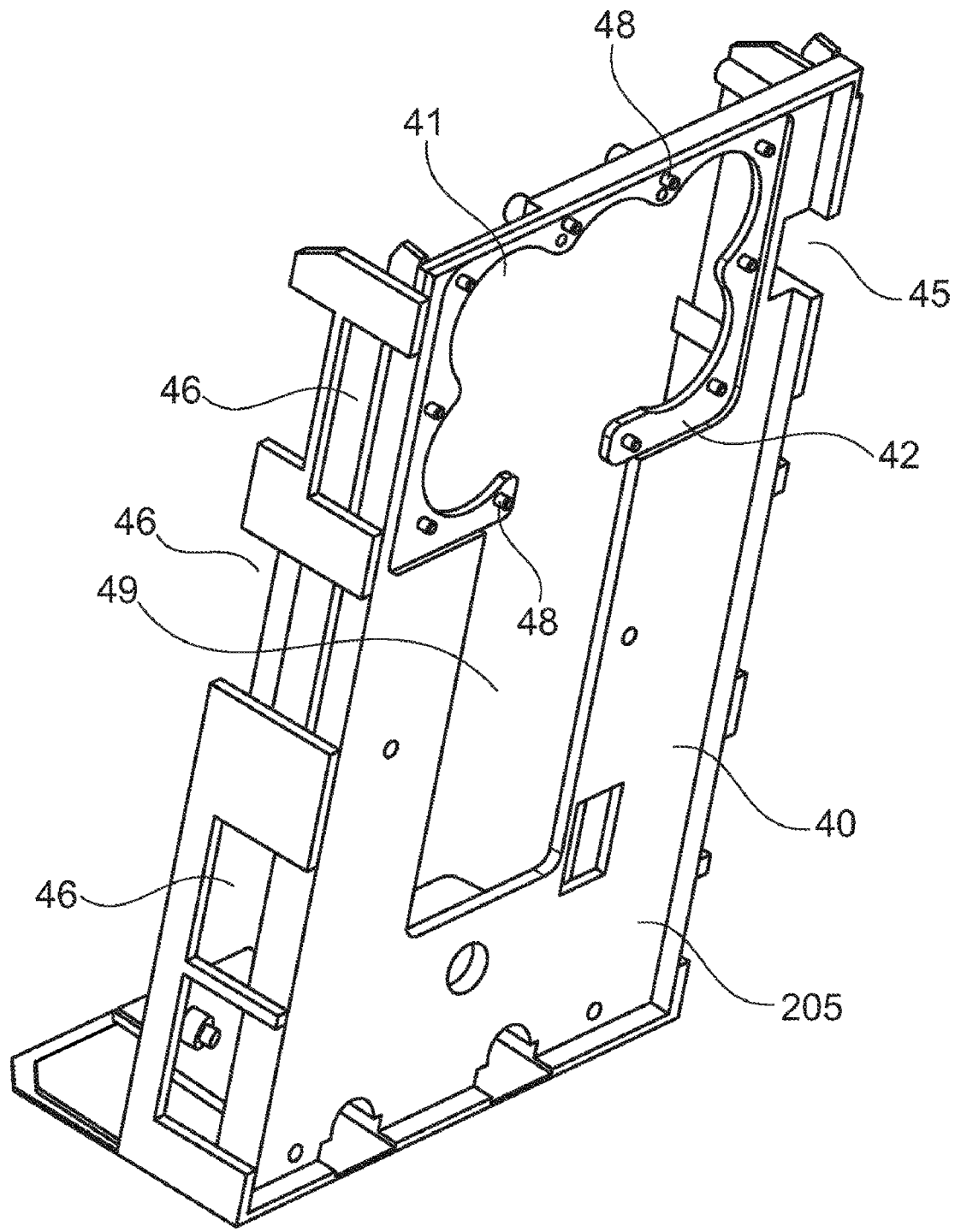
FIG. 6 shows an isolated perspective view of the lower part of the casing.
Figure 9:
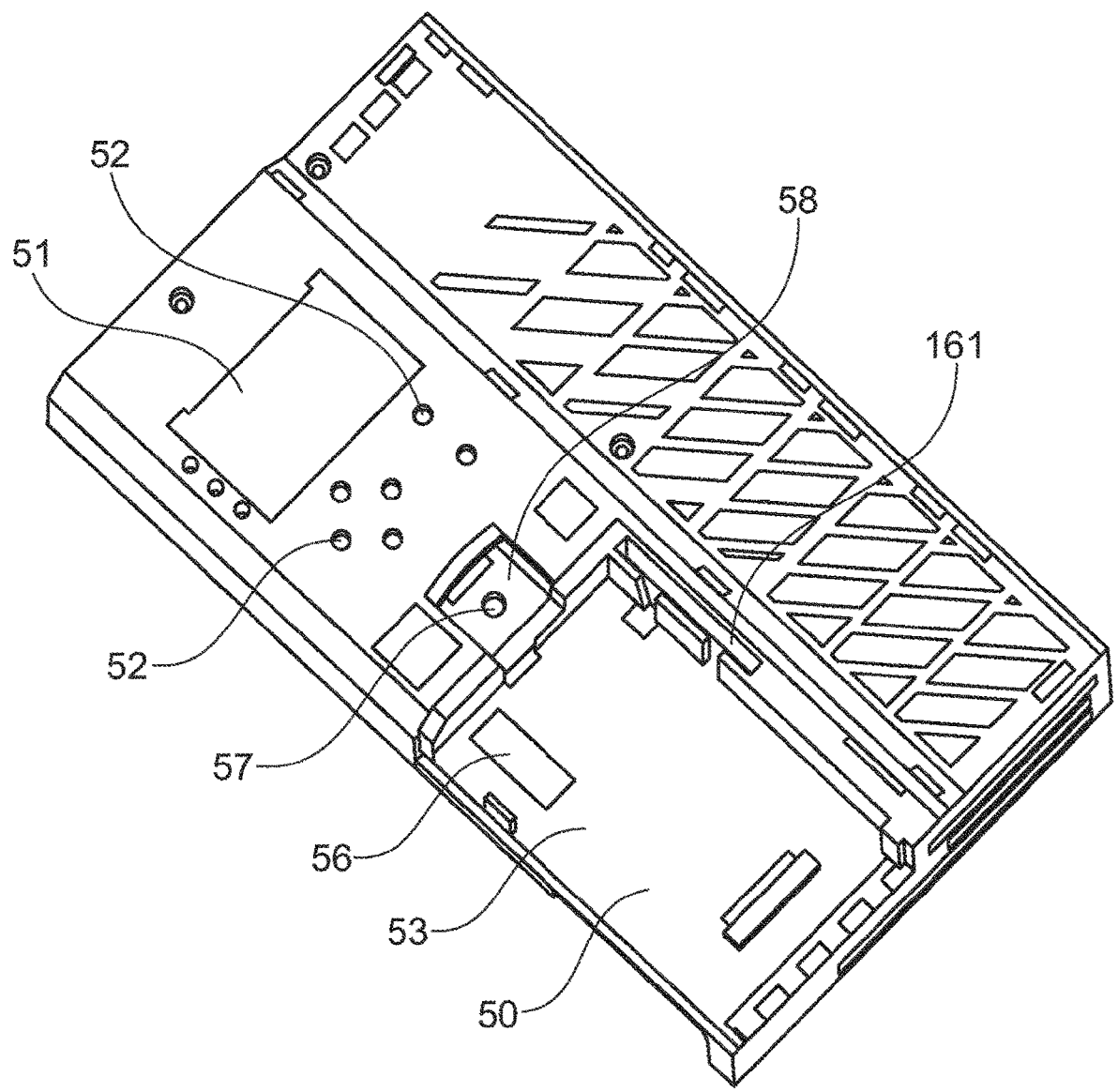
FIG. 9 shows an isolated view of the upper part of the casing.

The unit 1 comprises a casing comprising a lower part 40 and an upper part 50, shown in FIGS. 6 and 9, respectively.

These parts 40 and 50 are preferably made of plastic, that is preferably reinforced, but by way of a variation they are made of metal, for example, aluminum.

The lower part 40 is produced with an opening 41 for the passage of the capacitors 31.

A recess 42 is formed on the rear face of this lower part, around the opening 41, in order to accommodate a seal 70 formed by a sheet of elastomer material provided with holes for the passage of each capacitor 31. Thus, the seal 70 is applied both to the periphery of the cylindrical body of each capacitor 31 and to the faces facing the lower part 40 of the casing and the radiator 10.

A sealed output for the capacitors 31 is thus ensured and, in the event of water condensation on the fins 11 of the radiator, this water condensation is prevented from seeping into the casing.

Figure 4:
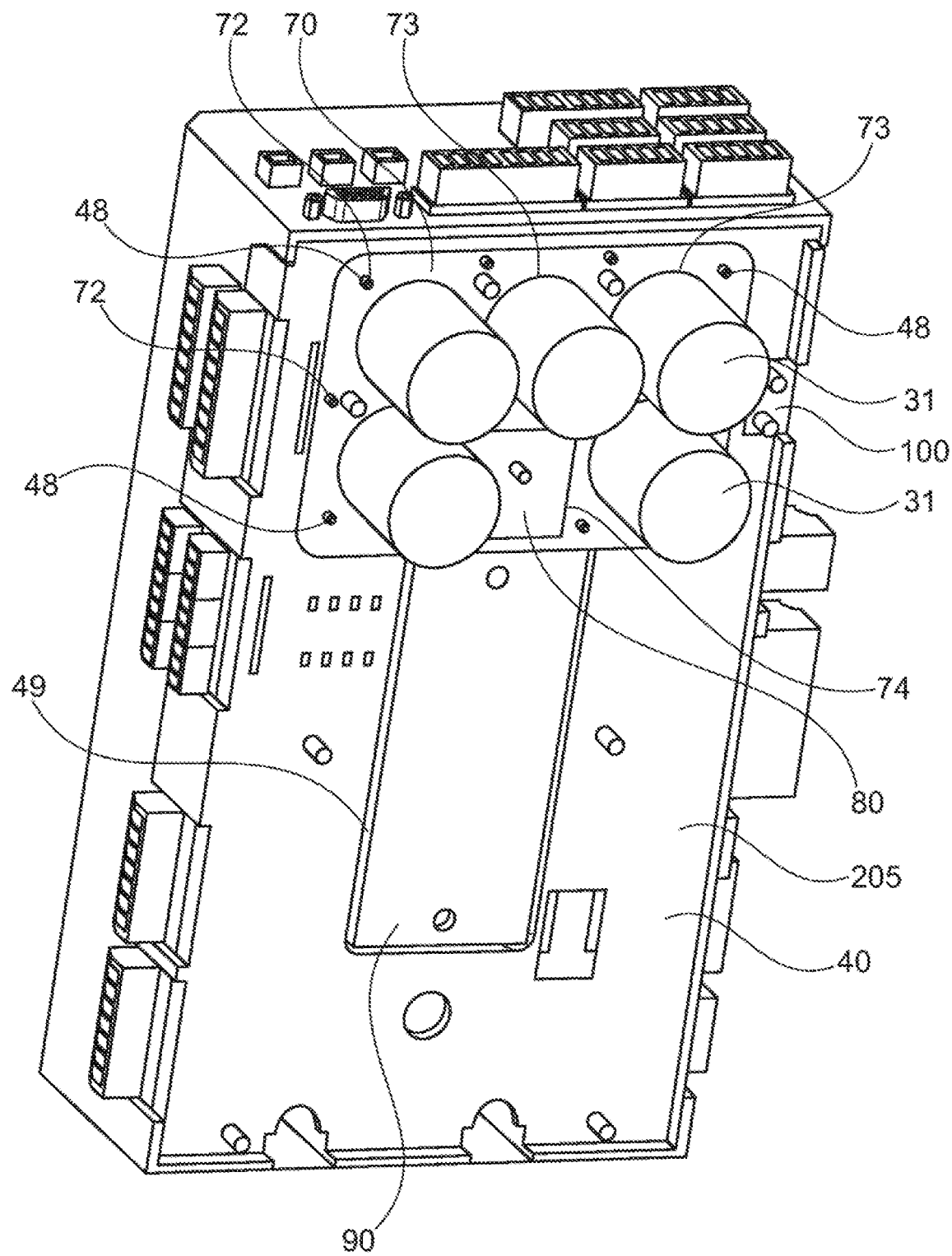
FIG. 4 shows the unit with the radiator removed.

In the considered example, the lower part of the casing 40 comprises positioning studs 48 and the seal 70 for the corresponding holes 72 (shown in FIG. 4).

In addition to the openings 73 for the passage of the capacitors 31, the seal 70 comprises, in the example shown, a window 74 for the passage of a spacer 80 that is attached against the radiator 10, the thickness of which is slightly greater than that of the seal 70.

The lower part 40 of the casing has an opening 49 for installing a power module 90 against the radiator 10. This opening 49 communicates with the opening 41, which allows a component to be cooled, for example, a diode bridge or any other component requiring a heat sink, to be attached on the spacer 80. As can be seen in FIG. 10C, which shows the power card 30 with the lower part 40 of the casing removed, the module 90 is soldered onto the printed circuit board 38 of the power card 30 using pins 92. These pins are connected to conductive tracks of the board 38. In the vicinity of the zone for soldering the pins 92 onto the board 38, slots 37 are produced in order to confer elasticity for the attachment of the module 90 on the board 38. Thus, said board can be pressed against the radiator 10 via its face that is opposite the board, even in the event of poor alignment between the board 38 and the internal face facing the radiator 10. The slots 37 limit the force on the pins of the module that is created by the assembly tolerances of the product.

The unit 1 comprises a control card 110 that is superposed on the power card and that comprises one or more microcontrollers or similar circuits for managing the operation of the unit 1.

An HMI interface card 120 is disposed above the control card 110 and comprises a display 121, as well as a plurality of control buttons 122 supported by a board 129.

The unit 1 also comprises cards 130 to 133 that support connectors and terminals that can be accessed from the lateral and lower faces of the casing.

These cards 130 to 133 are oriented perpendicular to the power 30 and control 110 cards. The lower part 40 of the casing is produced with openings 46 for the output of the connectors and terminals.

The unit 1 also comprises a card 190, which supports terminals and connectors and which is located on the side of the unit 1 opposite the card 130.

Figure 10A:
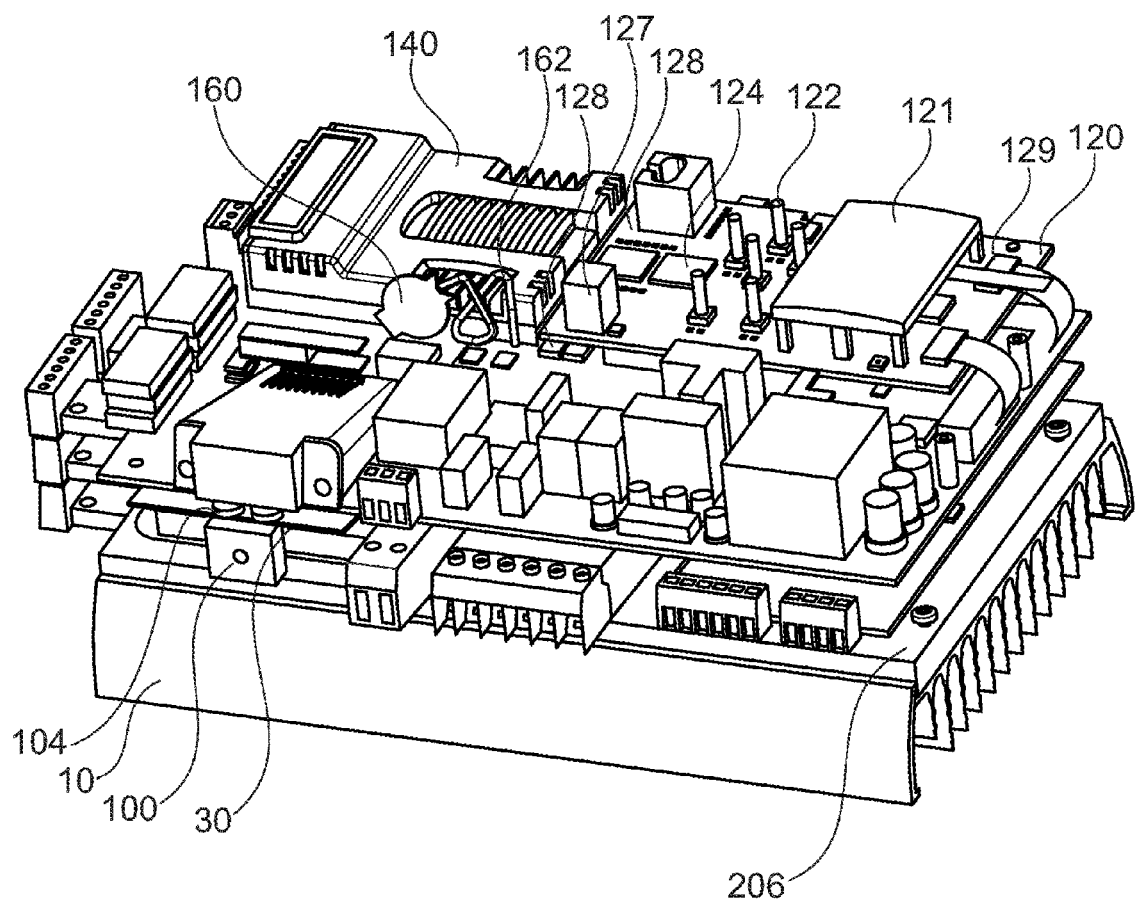
FIG. 10A shows the unit with the upper part of the casing removed.
Figure 10B:
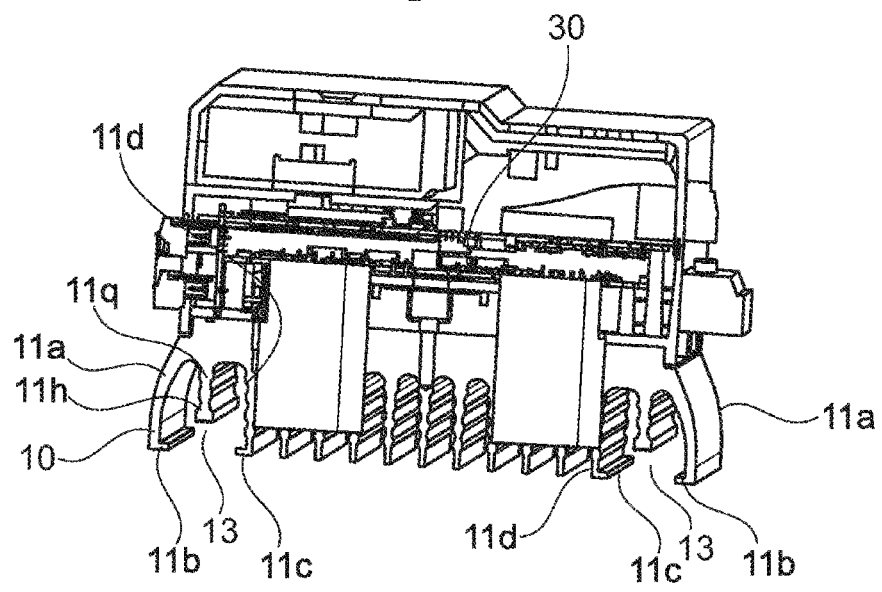
FIG. 10B is a transverse section view of the unit.
Figure 10C:
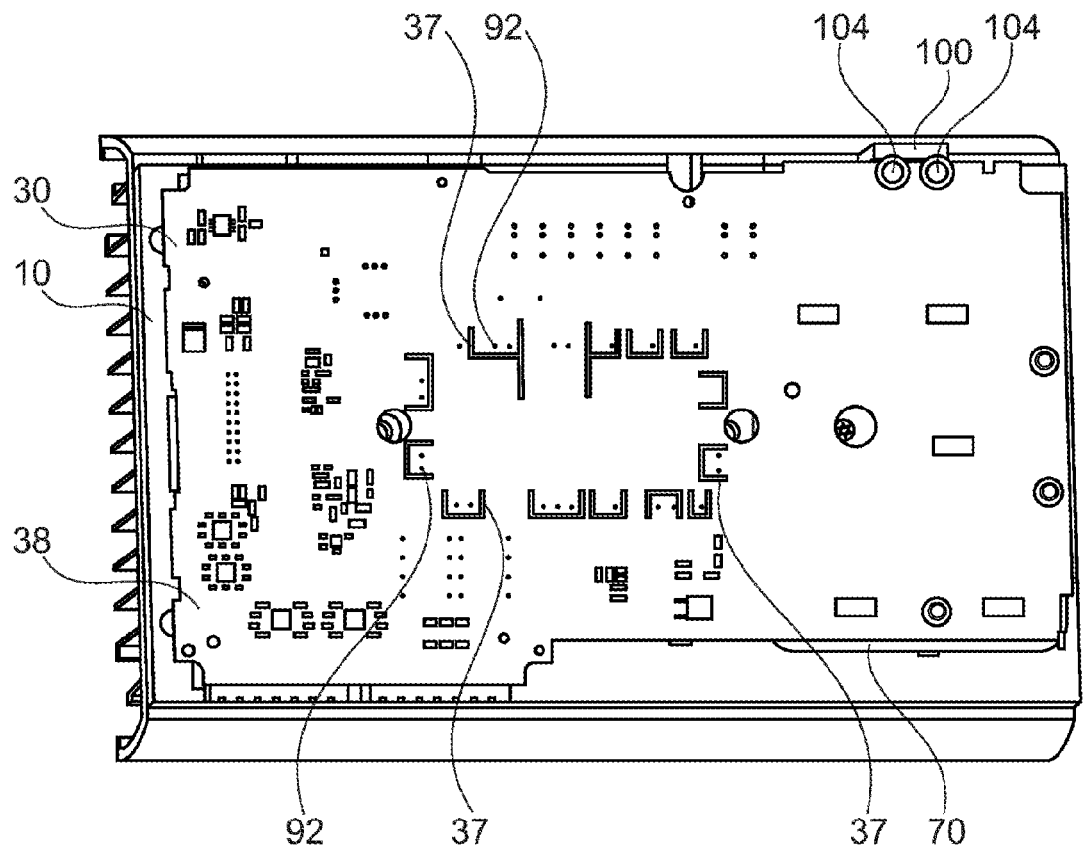
FIG. 10C shows the power card from the side of its face opposite the radiator.
Figure 10D:
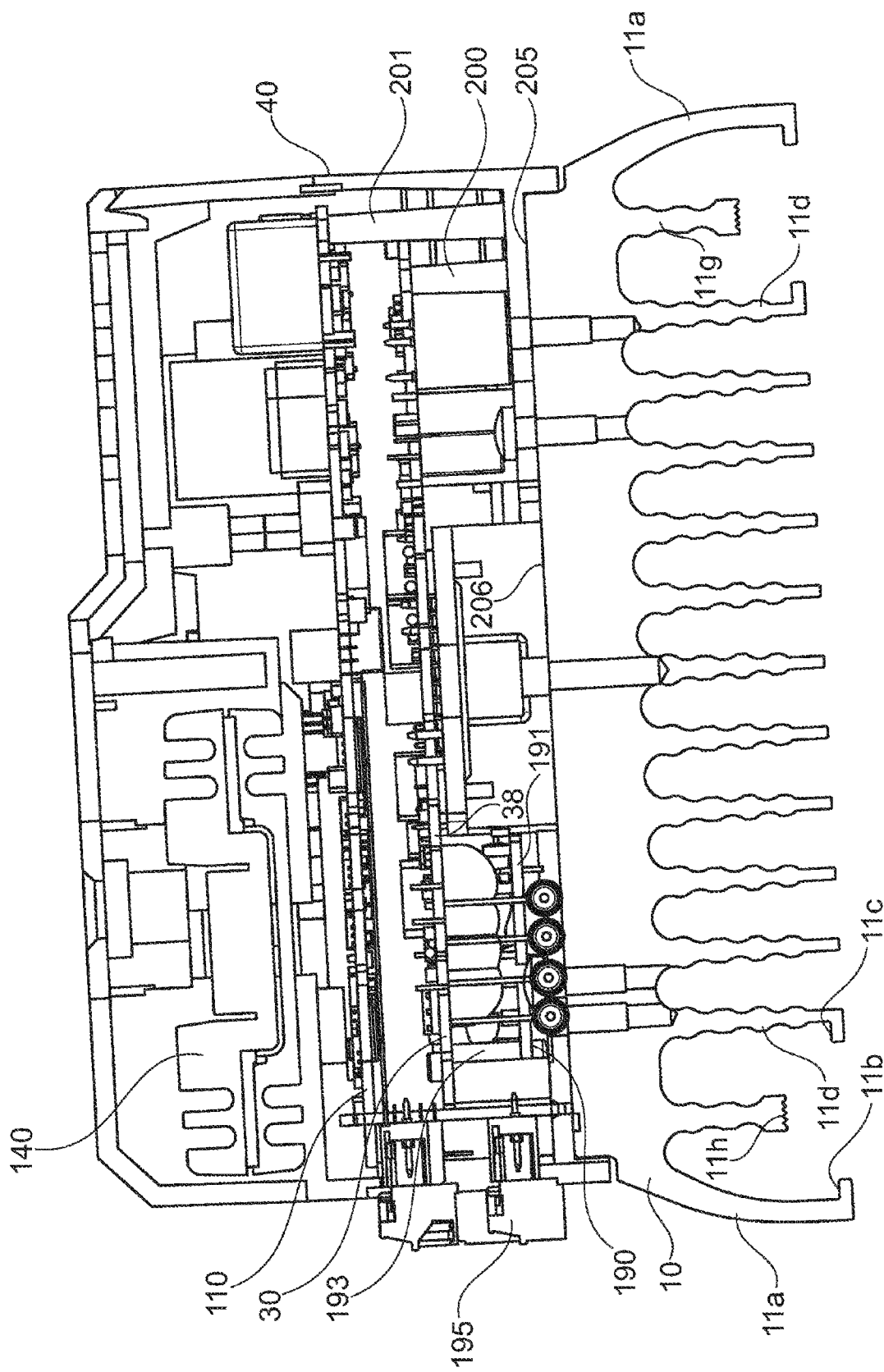
FIG. 10D is a schematic and partial transverse section view of the unit.
Figure 10E:
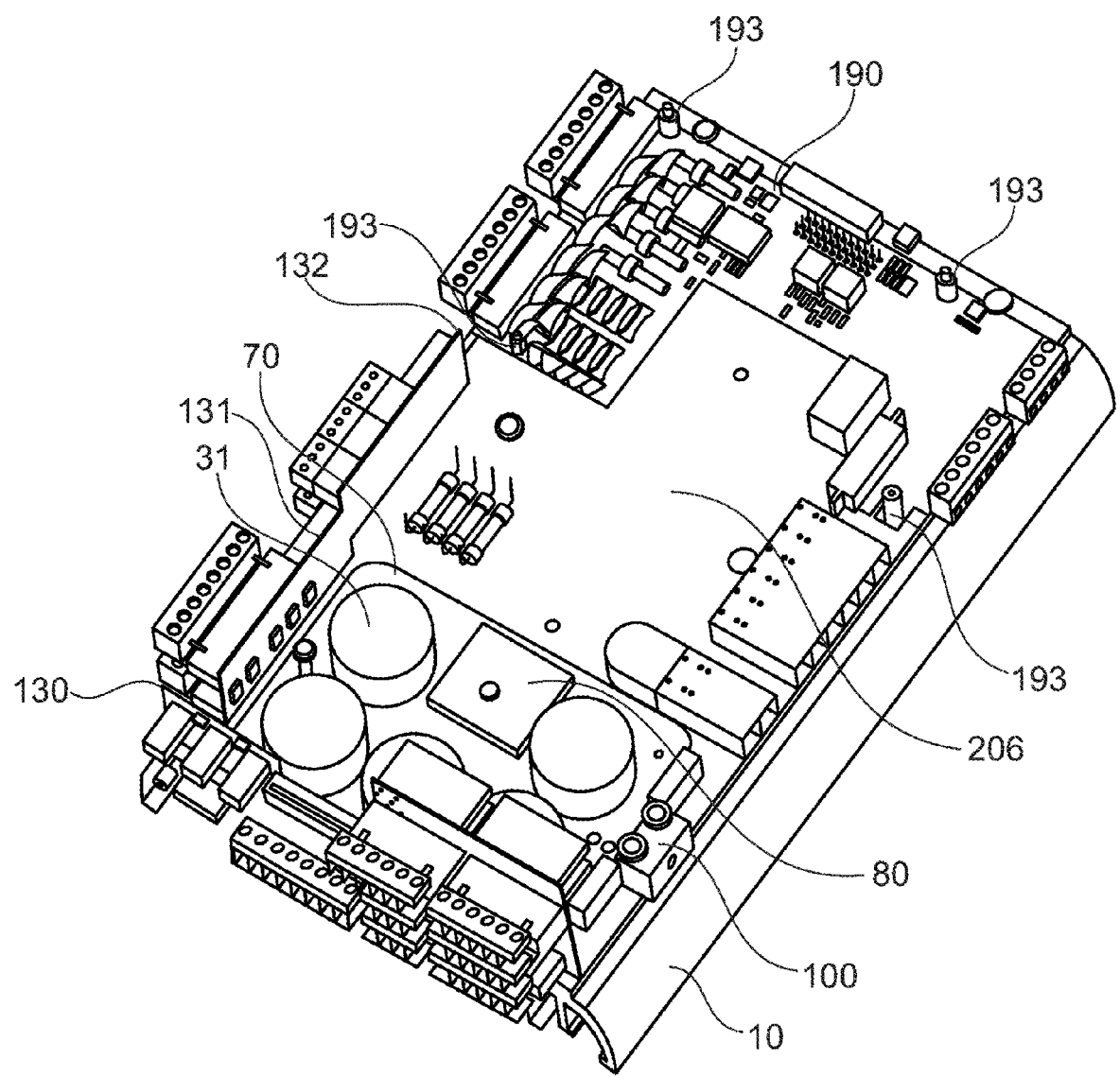
FIG. 10E shows the unit with the board of the power card removed.

As can be seen in FIGS. 10D and 10E, the card 190 comprises a printed circuit board 191 that extends parallel to the inner face of the radiator 10 between said radiator and the board 38 of the power card 30. The board 191 is attached on the board 38 using spacers 193.

FIG. 10D shows that the board 38 rests on shafts for receiving screws 200 of the lower part 40 and the board 118 of the card 110 rests on shafts 201. It also can be seen that the inner face 205 of the casing 40 rests on the inner face 206 of the radiator 10.

The board 191 supports connectors and/or terminals 195.

Ground Connection

The unit 1 comprises a part 100 that is used to attach a lug connected to the electrical ground and/or to earth. This part 100 is laterally accessible by virtue of a corresponding opening 45 produced on the lower part 40 of the casing, and has a tapped hole 101 for fixing a retention screw for the lug.

Figure 5:
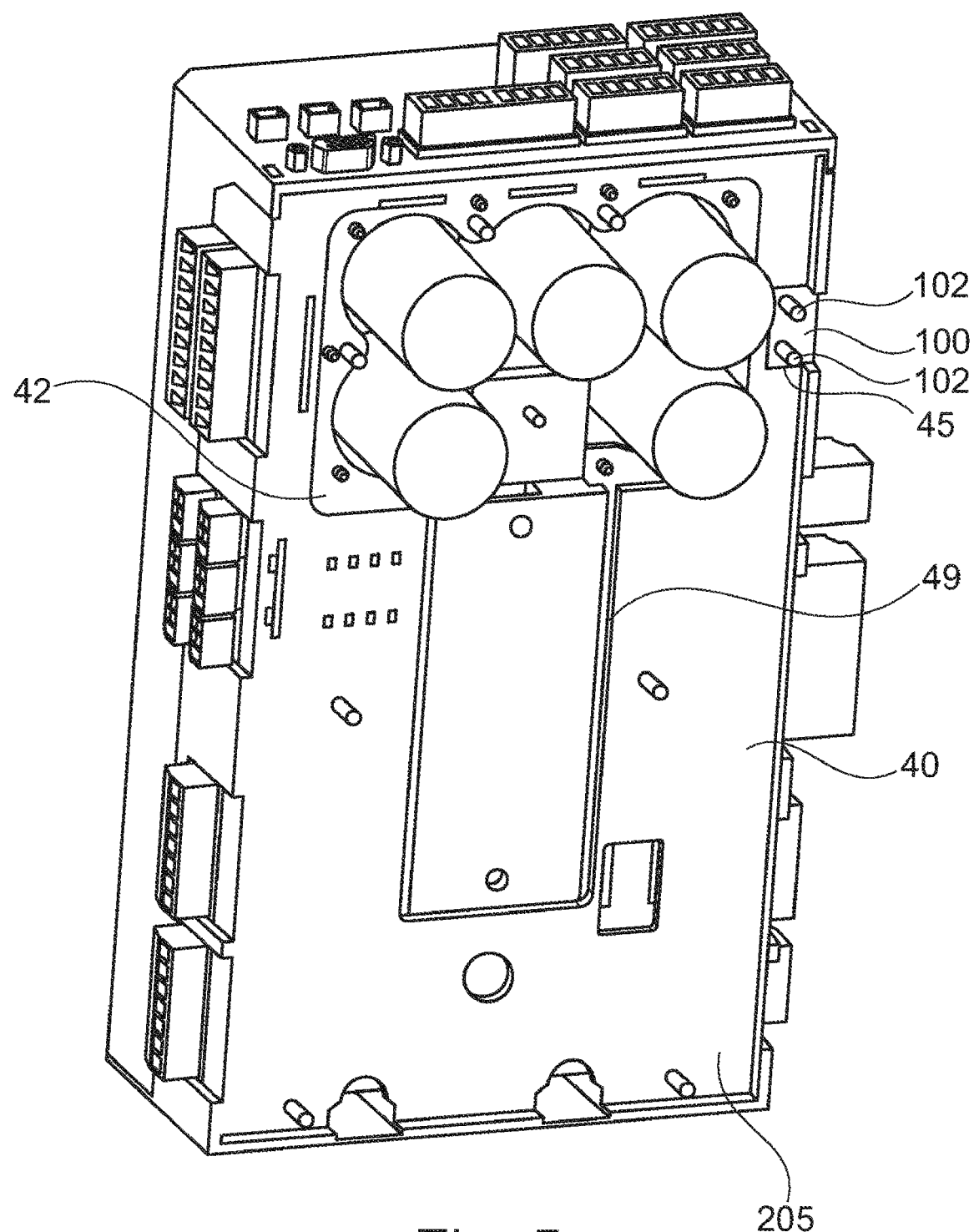
FIG. 5 is a view similar to FIG. 4 with the output seal of the capacitors removed.

The part 100 is attached to the radiator 10 using two screws 102, as shown in FIG. 5. These screws 102 provide an electrical contact between the radiator 10 and the part 100.

The screws 102 have heads 104 that are applied on corresponding conductive tracks of the power card 30 in order to electrically connect these tracks to the radiator 10 and to the ground and/or earth lug.

The part 100 thus fulfils a dual purpose, namely, on the one hand, that of providing the electrical connection between the radiator 10 and the power card 30 and an external connection via the lug and, on the other hand, that of providing mechanical attachment of the power card 30 on the radiator 10. The use of a single part fulfilling this dual purpose contributes to the compactness of the unit.

Memory Card Connector

The upper part 50 of the casing comprises, as can be seen in FIG. 9 in particular, an opening 51 for the screen 121 and holes 52 for the buttons 122.

Figure 8:
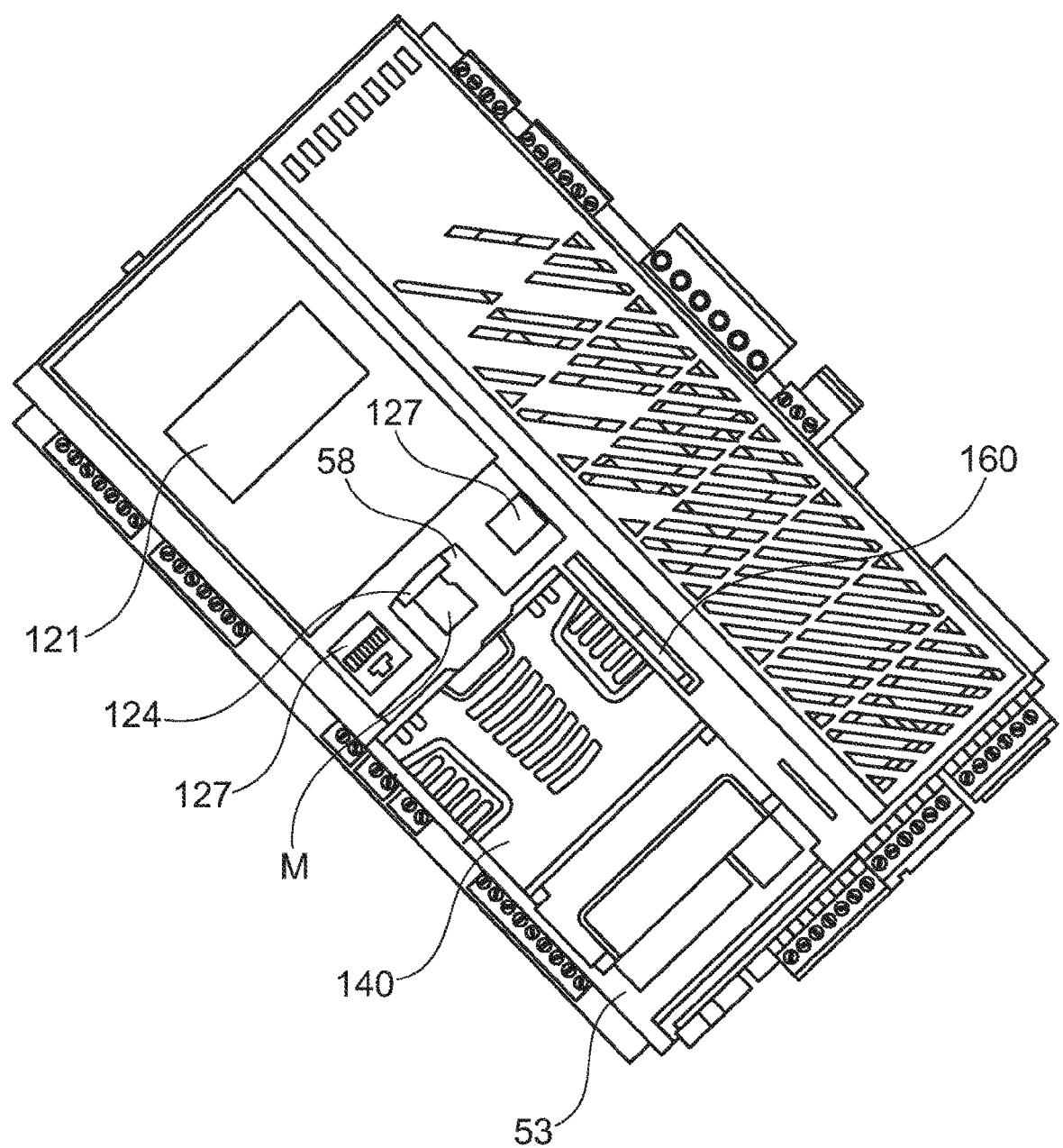
FIG. 8 is a view similar to FIG. 7 following the removal of the access hatch to the ancillary module.

A housing 53 is provided to accommodate an additional module 140, shown in FIG. 8, provided with a connector that connects to the control card through an opening 56 opening into the bottom of the housing 53.

Figure 7:
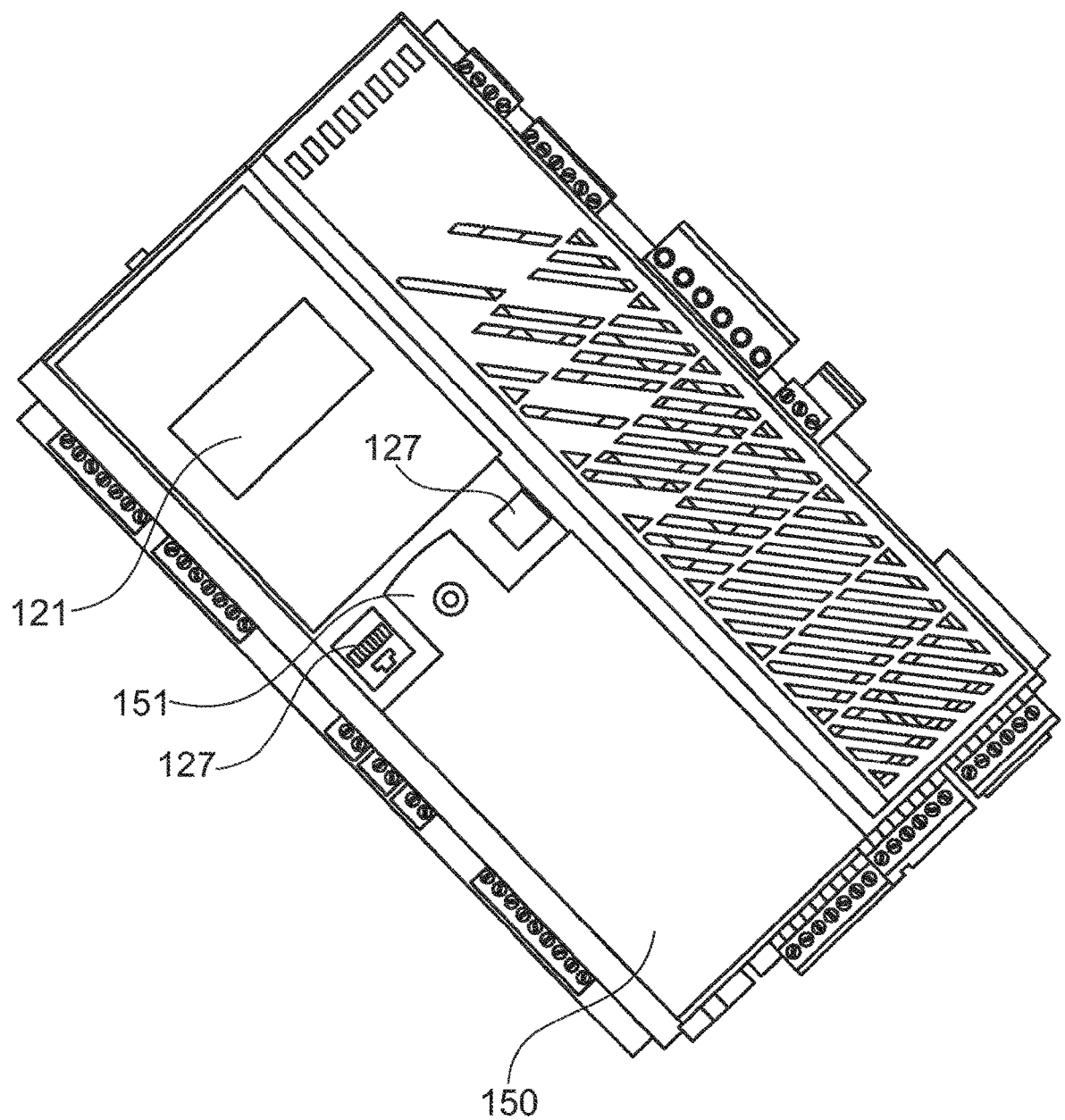
FIG. 7 shows a front view of the unit.

The housing 53 is sealed by a hatch 150, shown in FIG. 7 in particular, which is attached on the upper part 50 by a lug 151 provided with a screw that engages in a corresponding tapping 57 provided on the upper part 50.

Means such as a tamperproof label can be disposed on the hatch 150 in order to indicate the removal thereof.

The HMI interface card 120 supports a reader defining a housing 124 for a memory card M, for example, of the "micro SD" type, which opens into a recess 58 of the upper part 50 provided to accommodate the lug 151 for locking the hatch 150.

The unit 1 can be configured to record various operating parameters in the memory card M and thus provide a useful log for performing diagnostics in the event of a breakdown, for example. The memory card M also can be useful for firmware updating operations or for downloading specific parameters to the application.

The HMI interface card 120 also can support, as can be seen in FIG. 10 in particular, one or more front connector(s) 127, of the RJ45 or USB type, for example. The presence of these front access connectors facilitates the operations for updating, programming and performing diagnostics on the unit 1 by an operator.

These connectors 127 are supported by extensions 128 of the printed circuit board 129 of the card 120, which extend on both sides of the recess 58, thus contributing to the compactness of the assembly of the card 120 in the casing of the unit 1.

The unit 1 can comprise, as can be seen in FIG. 10A, a backup battery 160 connected by an electrical cable 162 to the control card 110. This backup battery 160 is flat and is oriented perpendicular to the control card 110, being housed in a corresponding housing 161 arranged in the upper part 50 of the casing next to the housing 53 accommodating the additional module 140.

Thus, it is possible to access this backup battery 160 by removing the hatch 150, as can be seen in FIG. 8, and the maintenance of the unit 1 is facilitated.

Power Transistor Redundancy

Figure 13:
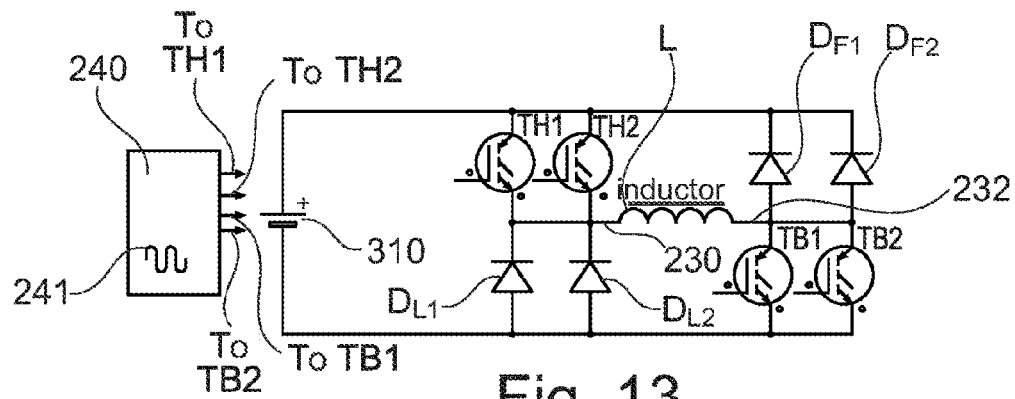
FIG. 13 is a diagram of the power bridge of the unit.

FIG. 13 shows a power half-bridge used to carry out a PWM type regulation when the unit 1 is an alternator regulator, with this half-bridge being connected by terminals 230 and 232 to the inductor L of the alternator. This figure also schematically shows a control circuit 240, belonging, for example, to the control card 110, and capable of generating a control signal 241.

The half-bridge shown in FIG. 13 features redundancy for the controlled power components, in order to ensure the control and the supply of the excitation current even in the event of the failure of one of these components, for example, the short-circuiting of a transistor or the permanent blocking of the transistor.

The half-bridge comprises a first pair TH1 and TH2 of power transistors electrically connected in parallel between the (+) terminal of the DC bus 310 and the terminal 230 of the inductor L. Two flyback diodes DL1 and DL2 are connected in parallel between the terminal 230 of the inductor L and the (−) terminal of the DC bus. The cathode of the diodes DL1 and DL2 is connected to the terminal 230.

The half-bridge comprises a second pair TB1, TB2 of power transistors, electrically connected in parallel between the (−) terminal of the DC bus and the terminal 232 of the inductor L. Two diodes DF1 and DF2 are disposed in parallel between the terminal 232 and the (+) terminal of the DC bus, with the cathode thereof being connected to this (+) terminal of the bus.

Monitoring is provided, for example, by the control circuit 240, in order to verify that the transistors TH1, TH2, TB1, TB2 operate without any failures. For example, the voltage at the terminals of the inductor L is monitored by the unit 1 to verify that it properly corresponds to the PWM control.

During normal operation, in the absence of a failure of the transistors, the transistor TB1 is controlled in continuous saturated mode and TB2 is maintained in the off-state on standby. Only the transistor TH1 receives the control signal 241, with the transistor TH2 being maintained in the off-state on standby.

When the transistor TH1 is conduction controlled, the current passes through this transistor, through the inductor and through the transistor TB1. When the transistor TH1 is in the off-state, the current circulating in the inductor circulates as a loop in the transistor TB1 and in the flyback diodes DL1 and DL2.

In the event of negative "forcing", i.e. when the current in the inductor L needs to be rapidly decreased in order to improve the voltage regulation response of the alternator upon load shedding, the transistor TB1 is in the off-state, and the current circulates through the diodes DL1, DL2 and DF1, DF2 and through the capacitors of the DC bus 310. This has the effect of inverting the voltage at the terminals of the inductor L and of causing the current therein to decrease more quickly.

The unit 1 processes various failure situations of the transistors.

Short-Circuit Breakage of TH1

The result of this failure is that this transistor no longer responds to the PWM command, and the excitation current rapidly increases in the inductor.

In order to resolve the fault, the transistor TH2 is controlled in the saturated state in order to maintain the short-circuit parallel with TH1 and the PWM command is sent to TB1; TB2 is maintained in the off-state.

Only the negative forcing function becomes unavailable, which represents an acceptable loss of operating performance.

Open Circuit Breakage of TH1

The effect of this failure is that the transistor no longer responds to the PWM command and the excitation current decreases rapidly.

In order to respond to this failure, the transistor TH1 is controlled in the off-state in order to prevent any potential erratic switching operations, and the transistor TH2 receives the PWM command instead of TH1. TB1 is maintained in the saturated state and TB2 is maintained in the off-state.

A normal state for regulating the current in the inductor is ensured once again.

Short-Circuit Breakage of TB1

As the normal operating mode of this transistor is the saturated mode, this failure does not have any impact on the excitation current, except for the loss of performance associated with the inability to perform negative forcing.

As long as the short-circuit is maintained, no correction needs to be made to the control in terms of regulating the alternator current during normal operation.

Open Circuit Breakage of TB1

This failure results in a rapid decrease of the current in the inductor, with the transistor no longer responding to the command maintaining its saturation.

In order to overcome this failure, the transistor TB1 is controlled in the off-state to avoid any possible erratic switching operations. The transistor TB2 receives the saturated command instead of TB1. The transistor TH1 continues to receive the PWM command and the transistor TH2 is controlled in the off-state.

A normal state for controlling the excitation current is ensured once again.

Figure 14:
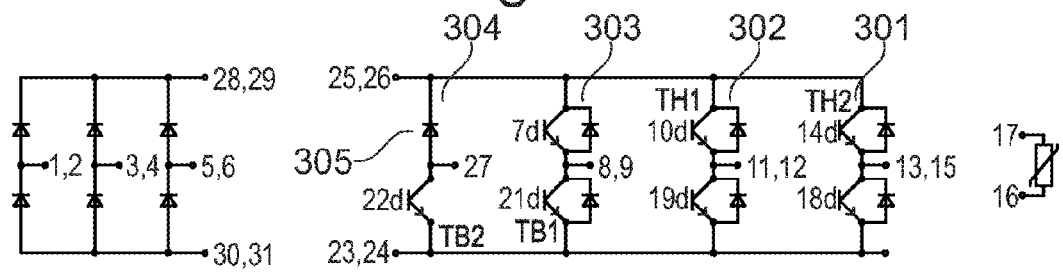
FIG. 14 shows the correspondence between the transistors of the bridge and the power module in one embodiment.

In one embodiment of the invention, the transistors TB1, TB2, TH1 and TH2 belong to a monolithic power module 90, shown in FIG. 14, that comprises seven transistors, which are marketed for another application, with these transistors being distributed in three parallel branches 301, 302, 303 each comprising two transistors in series and a seventh transistor in parallel with the three branches, in series with a diode 305.

FIG. 14 shows the transistors of the module 90 that can be used to form the transistors TB1, TB2, TH1 and TH2.

This involves the transistors at the top of the branches 302, 301 for the transistors TH1 and TH2 and the transistor at the bottom of the remaining branch 303 for the transistor TB1, with the transistor TB2 being formed by the transistor that is in series with the diode 305.

The invention is not limited to the example presently described. In particular, the power stage can be produced with discrete components instead of with a module consolidating said components.

The invention claimed is:

1. An electronic device, comprising:
a power stage to be connected to an inductive load, including at least one first pair of power transistors connected to a terminal of a DC bus, and a control circuit for said first pair of power transistors, the first pair of power transistors being disposed in parallel between said terminal of the DC bus and a first output to be connected to the inductive load, at least one flyback diode connecting an opposite terminal of the DC bus to the first output, the control circuit being configured to generate a pulsed control signal for regulating current in the load and for detecting a failure of one of the first pair of power transistors, the control circuit being configured, during normal operation, in the absence of a failure of the first pair of power transistors, to send the control signal to a first one of the first pair of power transistors, while maintaining a second one of said first pair of power transistors in an off-state; and
a second pair of transistors connected in parallel between a second output to be connected to the inductive load and the opposite terminal of the DC bus, at least one diode connecting the second output to the terminal of the DC bus, at least a first one of the second pair of transistors being controlled by the control circuit in order to be in an on-state during normal operation,
wherein the control circuit is configured, in the event of the failure of the first one of the first pair of power transistors causing the first one of the first pair of power transistors to remain in an open circuit, to control the second one of the first pair of power transistors in order to saturate said second one of the first pair of power transistors, to maintain a first one of the second pair of transistors in the off-state and to send the pulsed control signal to a second one of said second pair of transistors.

2. The device as claimed in claim 1, wherein a second one of the second pair of transistors is controlled by the control circuit in order to be in an off-state during normal operation.

3. The device as claimed in claim 1, wherein the control circuit is configured, in the event of the failure of the first one of the second pair of transistors causing the first one of the second pair of transistors to remain in an open circuit, to control a second one of the second pair of transistors in order to saturate said second one of the second pair of transistors.

4. The device as claimed in claim 1, comprising two flyback diodes in parallel.

5. The device as claimed in claim 1, comprising two diodes in parallel connecting the second output to the terminal of the DC bus.

6. The device as claimed in claim 1, wherein the device is configured to operate in negative forcing mode when the current in the inductive load has to be rapidly cancelled for purposes of the regulation, the negative forcing mode being a mode for inverting voltage at the terminals of the inductive load, and in which transistors of both the first pair of power transistors and the second pair of transistors are controlled in the off-state.

7. The device as claimed in claim 1, the pulsed control signal being a PWM (Pulse Width Modulation) control signal.

8. The device as claimed in claim 1, wherein the first pair of power transistors belonging to a power module comprising three branches in parallel, each branch comprising two transistors in series, and a seventh transistor in series with a diode, an assembly formed by the seventh transistor in series with the diode being connected in parallel with the three branches, the first pair of power transistors each being held within a respective branch.

9. The device as claimed in claim 8, wherein a first one of a second pair of transistors is held within a remaining branch and a second one of the second pair of transistors is formed by the seventh transistor that is in series with the diode.

10. The device as claimed in claim 1, the first pair of power transistors are IGBTs or MOSFETs.

11. The device of claim 1, wherein the device is an alternator regulator.

12. The device as claimed in claim 1, wherein the first pair of power transistors are disposed in such way that a drain of a first transistor and a drain of a second transistor are directly connected to each other, and a source of the first transistor and a source of the second transistor are directly connected to each other.

13. The device as claimed in claim 1, wherein the control circuit is configured, in the event of the failure of the first one of the first pair of power transistors causing the first one of the first pair of power transistors to remain in an open circuit, to send the pulsed control signal to the second one of the first pair of power transistors.

14. A method for regulating an alternator, in which an inductor of the alternator is connected to the outputs of a regulator including a power stage including a first pair of power transistors connected in parallel between a terminal of a DC bus and a first terminal of the inductor, a second pair of transistors connected in parallel between a second terminal of the inductor and an opposite terminal of the DC bus, at least one diode connecting the second terminal of the inductor to the terminal of the DC bus, at least one flyback diode connecting the opposite terminal of the DC bus to the first terminal of the inductor, and a control circuit configured to generate a pulsed control signal for regulating current in the inductor and for detecting a failure of one of the first pair of power transistors and the second pair of transistors, the method comprising:
- controlling, during normal operation of the regulator, at least a first one of the second pair of transistors by the control circuit to be in the on-state, the control signal being sent to a first one of the first pair of power transistors, while maintaining a second one of said first pair of power transistors in an off-state;
- controlling, in event of a request for rapid cancellation of the current in the inductor for purposes of the regulation, the first pair of power transistors and the second pair of transistors in the off-state;
- sending, in event of a failure of the first one of the first pair of power transistors causing the first one of the first pair of power transistors to remain in an open circuit, the pulsed control signal to the second one of said first pair of power transistors for the purposes of regulating the current in the inductor;
- controlling, in event of failure of the first one of the second pair of transistors causing the first one of the second pair of transistors to remain in an open circuit, a second one of said second pair of transistors in order to saturate said first one of the second pair of transistors;
- controlling, in event of failure of the first one of the first pair of power transistors causing the first one of the first pair of power transistors to remain in an open circuit, the second one of said first pair of power transistors in order to saturate the first one of the first pair of power transistors with the failure;
- maintaining, in the event of the failure of the first one of the first pair of power transistors causing the first one of the first pair of power transistors to remain in an open circuit, the first one of the second pair of transistors in the off-state; and
- sending, in the event of the failure of the first one of the first pair of power transistors causing the first one of the first pair of power transistors to remain in an open circuit, the pulsed control signal to the second one of said second pair of transistors for the purposes of regulating the current in the inductor.

15. An electronic device, comprising:
- a power stage to be connected to an inductive load, including at least one first pair of power transistors connected to a terminal of a DC bus, and a control circuit for said first pair of power transistors, the first pair of power transistors being disposed in parallel between said terminal of the DC bus and a first output to be connected to the inductive load, at least one flyback diode connecting an opposite terminal of the DC bus to the first output, the control circuit being configured to generate a pulsed control signal for regulating current in the load and for detecting a failure of one of the first pair of power transistors, the control circuit being configured, during normal operation, in the absence of a failure of the first pair of power transistors, to send the control signal to a first one of the first pair of power transistors, while maintaining a second one of said first pair of power transistors in an off-state; and
- a second pair of transistors connected in parallel between a second output to be connected to the inductive load and the opposite terminal of the DC bus, at least one diode connecting the second output to the terminal of the DC bus, at least a first one of the second pair of transistors being controlled by the control circuit in order to be in an on-state during normal operation,
- wherein the device is configured to operate in negative forcing mode when current in the inductive load has to be rapidly cancelled for purposes of the regulation, the negative forcing mode being a mode for inverting voltage at the terminals of the inductive load, and in which transistors of both the first pair of power transistors and the second pair of transistors are controlled in the off-state.

* * * * *